United States Patent
Ho et al.

(10) Patent No.: US 9,591,761 B2
(45) Date of Patent: Mar. 7, 2017

(54) SCREEN CONTROL MODULE HAVING GREATER ANTI-WARP STRENGTH OF A MOBILE ELECTRONIC DEVICE AND CONTROLLER THEREOF

(71) Applicant: ELAN MICROELECTRONICS CORPORATION, Hsinchu (TW)

(72) Inventors: Ming-Lung Ho, Yangmei (TW); Chien-Wen Tsai, Zhubei (TW)

(73) Assignee: ELAN MICROELECTRONICS CORPORATION, Hsin Chu (TW)

( * ) Notice: Subject to any disclaimer, the term of this patent is extended or adjusted under 35 U.S.C. 154(b) by 0 days.

(21) Appl. No.: 14/927,051

(22) Filed: Oct. 29, 2015

(65) Prior Publication Data

US 2016/0050758 A1    Feb. 18, 2016

Related U.S. Application Data

(62) Division of application No. 13/802,845, filed on Mar. 14, 2013, now Pat. No. 9,207,719.

(30) Foreign Application Priority Data

Dec. 14, 2012   (TW) .............................. 101147414 A

(51) Int. Cl.
  *G06F 1/16*   (2006.01)
  *H05K 1/02*   (2006.01)
  (Continued)

(52) U.S. Cl.
  CPC ............. *H05K 1/18* (2013.01); *G06F 1/1658* (2013.01); *H01L 23/3738* (2013.01);
  (Continued)

(58) Field of Classification Search
  CPC ............... G06F 1/1658; H01L 23/4334; H01L 23/3738; H01L 23/3128; H01L 2224/16225; H01L 2224/48091; H01L 2224/48227
  See application file for complete search history.

(56) References Cited

U.S. PATENT DOCUMENTS 5,814,890 A  *  9/1998  Iwasaki ................. H01L 21/563
                                                       257/737
6,525,407 B1 *  2/2003  Drewery ............. H01L 21/4846
                                                       257/666
(Continued)

FOREIGN PATENT DOCUMENTS

CN         1154487 A       7/1997
CN         1866115 A      11/2006
(Continued)

*Primary Examiner* — Ryan A Lubit
(74) *Attorney, Agent, or Firm* — Birch, Stewart, Kolasch & Birch, LLP

(57) ABSTRACT

A screen control module of a mobile electronic device has at least one controller formed on a circuit board. The circuit board has multiple solder pads formed on the circuit board and respectively aligning along a first direction and a second direction. An amount of the solder pads along the first direction is greater than that along the second direction. The controller is formed by an integrated circuit with a package, and the aspect ratio of the package is not less than 2. The package has multiple electrical contacts respectively aligning along a length direction and a width direction. Each electrical contact aligns with and is electrically connected to a corresponding solder pad. Accordingly, the screen control module mounted within a side frame of a display of the mobile electronic device can increase the aspect ratio to meet the demand for narrowing the side frame of the display.

16 Claims, 11 Drawing Sheets

(51) Int. Cl.
*H05K 1/11* (2006.01)
*H01L 23/373* (2006.01)
*H01L 23/433* (2006.01)
*H05K 1/18* (2006.01)
*H01L 23/00* (2006.01)
*H01L 23/31* (2006.01)

(52) U.S. Cl.
CPC .......... *H01L 23/4334* (2013.01); *H01L 24/19* (2013.01); *H05K 1/02* (2013.01); *H05K 1/111* (2013.01); *H01L 23/3128* (2013.01); *H01L 2224/16225* (2013.01); *H01L 2224/45147* (2013.01); *H01L 2224/48091* (2013.01); *H01L 2224/48227* (2013.01); *H01L 2924/15311* (2013.01); *Y02P 70/611* (2015.11)

(56) References Cited

U.S. PATENT DOCUMENTS

| | | |
|---|---|---|
| 7,108,516 B2 | 9/2006 | Naitoh et al. |
| 2002/0021382 A1 | 2/2002 | Hasegawa |
| 2008/0136004 A1* | 6/2008 | Yang ........................ H01L 24/96 257/686 |
| 2010/0072618 A1* | 3/2010 | Camacho ............ H01L 21/6835 257/738 |
| 2011/0155433 A1 | 6/2011 | Funaya et al. |
| 2012/0080219 A1* | 4/2012 | Takeuchi ............ H01L 21/4846 174/259 |
| 2013/0128474 A1* | 5/2013 | Kang .................... H05K 1/0271 361/749 |
| 2014/0312498 A1* | 10/2014 | Sugiyama ............... H01L 24/81 257/741 |

FOREIGN PATENT DOCUMENTS

| | | |
|---|---|---|
| TW | 200632424 A | 9/2006 |
| TW | I264689 B | 10/2006 |
| TW | 200643846 | 12/2006 |
| TW | 200828564 A | 7/2008 |
| TW | 201230278 A1 | 7/2012 |
| TW | 201236089 A1 | 9/2012 |

* cited by examiner

SCREEN CONTROL MODULE HAVING GREATER ANTI-WARP STRENGTH OF A MOBILE ELECTRONIC DEVICE AND CONTROLLER THEREOF

CROSS-REFERENCE TO RELATED APPLICATIONS

This application is a Divisional application of co-pending application Ser. No. 13/802,845, filed on Mar. 14, 2013, which claims priority under 35 U.S.C. §119(a) to Taiwanese Application No. 101147414, filed in Taiwan on Dec. 14, 2012, all of which are hereby expressly incorporated by reference into the present application.

BACKGROUND OF THE INVENTION

1. Field of the Invention

The present invention relates to a screen control module of a mobile electronic device and a controller of the screen control module, and more particularly to a screen control module of a mobile electronic device with an increased aspect ratio to meet the requirement of reducing the width of a side frame around a display of the mobile electronic device.

2. Description of the Related Art

The rising tablet computers have re-prioritized the importance of all types of computers in the computer market and have further squeezed their market share. Tablet computers impact most directly on notebook computers in terms of the market acceptance. From the perspective of fashion and technology, it is not very difficult to image why tablet computers can sweep the computer market. However, when compared in terms of practicability, notebook computers still own advantages and features that tablet computers cannot surpass. For example, tablet computers rely on excellent touch interfaces in support of humanized and intuitive operation, but when it comes to large text input, the drawback of handwriting input is quite obvious because the speed of handwriting input is far lower than the speed of keyboard input, which approximately rates tens of characters per minute. Although notebook computers fall behind tablet computers in some categories, such as size, weight, battery standby time and the like, tablet computers are still unable to replace notebook computer for the sake of intended operation functions and purposes.

From the foregoing, in some degrees, notebook computers can still maintain their strength in the computer market. Despite the strength, manufacturers of notebook computers still constantly develop and improve techniques related to notebook computers. Among all the developed and improved techniques, laptop lid is one of the categories attracting much attention. With reference to FIG. 8, a conventional notebook computer has a base 70 having a keyboard 71, a lid 72 pivotally mounted on one side edge and having a display monitor 73 mounted within the lid 72. With reference to FIG. 9, the lid 72 has a rectangular side frame 720 formed on an inner surface of the display monitor 73 proximal to the base 70, and the display monitor 73 is mounted within the side frame 720. The side frame 720 defines an effective display area of the display monitor 73. Hence, the size of the effective display area is directly determined by the width of the side frame 720. However, the side frame 720 of the lid 72 is indispensable and mainly functions to fix and protect the display monitor 73. More importantly, a screen control module for driving the display monitor 73 and/or a touch panel, if the touch panel is mounted on the display monitor 73 is also mounted inside the side frame 720.

The so-called screen control module has at least one controller 81 mounted on a circuit board 80. The at least one controller 81 is electrically connected to the display monitor 73 and/or the touch panel through wires and connectors 82 on the circuit board 80. When consumers further demand for a larger effective display area of the display monitor 73, first thing that comes to mind is to reduce the width of the side frame 720 of the lid 72. Nevertheless, the side frame reduction should also take the width of the screen control module into account. The side frame reduction is possible only when the width of the screen control module can be reduced.

Given the composition of conventional screen control modules, a barrier exists for the width reduction of the conventional screen control modules. With reference to FIG. 10, the foregoing screen control module has at least one controller 81 mounted on a circuit board 80, at least one connector 82 and multiple passive components 83. The reduction of the screen control module first depends on if the width of the circuit board 80 can be reduced, and the width reduction of the circuit board 80 depends on the sizes of components mounted on the circuit board 80. The most size-dominant component on the circuit board 80 is the at least one controller 81. However, the packaging structure for the conventional controller 81 still has a considerable width. Under the circumstance, to meet the requirement of the mounted components with reduced width, the circuit board 80 must be larger than the width of the controller 81.

As a summary, when the computer market further demands for enlarged effective display area on the display monitor of the lid, the width reduction of the side frame of the lid should be considered. However, the width of the side frame is limited by the width of the screen control module. Therefore, to reduce the width of the side frame of the lid, a concrete solution targeting at the width reduction of the screen control module should be provided.

SUMMARY OF THE INVENTION

A first objective of the present invention is to provide a screen control module of a mobile electronic device targeting at a controller mounted on a circuit board and having a package with a desired aspect ratio so that the circuit board can increase its aspect ratio and reduce a width of the screen control module to prevent the screen control module from dominating the width of the side frame of the display.

To achieve the foregoing objective, the screen control module of the mobile electronic device has a circuit board and at least one controller.

The circuit board has a surface and multiple solder pads. The solder pads respectively align along a first direction and a second direction. An amount of the solder pads along the first direction is greater than an amount of the solder pads along the second direction. Each one of the at least one controller is formed by an integrated circuit having a package on the surface of the circuit board. The package has a length and a width, an aspect ratio between the length and the width of the package is greater than or equal to two, the package has multiple electrical contacts respectively aligning along a direction of the length and a direction of the width, and the electrical contacts respectively align with one of the solder pads, wherein the package has a packaging substrate, the packaging substrate comprises a first metal layer having a first width and a second metal layer having the first width, and wherein an area between the first and second metal layers has the first width and consists of a single dielectric layer made of a dielectric material and multiple layers of fiber cloths.

In the foregoing screen control module of a mobile electronic device, the solder pads on the circuit board respectively align along the different first and second directions, and the amount of the solder pads along the first direction is greater than that along the second direction, so as to constitute an elongated electrical connection interface. The electrical contacts on the package of the controller have a corresponding arrangement and align with the respective solder pads on the circuit. Therefore, the aspect ratio of the package of the controller should not be less than two. Under the circumstance of reducible width of the package of the controller, the width of the circuit board of the screen control module can be also reduced so that it is possible for a flip-up lid of the mobile electronic device to narrow its side frame and enlarge an effective display area of a display monitor.

A second objective of the present invention is to provide a controller of a screen control module having a package with a desired aspect ratio and satisfying applications requiring elongated electrical connection interfaces.

The controller has an integrated circuit. The integrated circuit has a package that is elongated. The package has a length and a width, an aspect ratio between the length and the width of the package is greater than or equal to two, the package has multiple electrical contacts respectively aligning along a direction of the length and a direction of the width, and an amount of the electrical contacts along the direction of the length is greater than an amount of the electrical contacts along the direction of the width, wherein the package has a packaging substrate, the packaging substrate comprises a first metal layer having a first width and a second metal layer having the first width, and wherein an area between the first and second metal layers has the first width and consists of a single dielectric layer made of a dielectric material and multiple layers of fiber cloths.

As the package of the foregoing controller has the aspect ratio being greater than or equal to two, the electrical contacts on the package can respectively align along the directions of the length and the width, the amount of the electrical contacts aligning along the direction of the length is greater than that along the direction of the width, thereby rendering applicability to the controller for being formed on a packaging substrate with elongated electrical connection interfaces.

Other objectives, advantages and novel features of the invention will become more apparent from the following detailed description when taken in conjunction with the accompanying drawings.

DETAILED DESCRIPTION OF THE INVENTION

A screen control module in accordance with the present invention is applied to a mobile electronic device. The so-called mobile electronic device includes, but is not limited to, notebook computers, electronic dictionaries and other electronic devices each having a flip-up lid and a display monitor mounted on the lid. When the screen control module is applied to a notebook computer, the screen control module is mounted inside the flip-up lid of the notebook computer.

Figure 1:
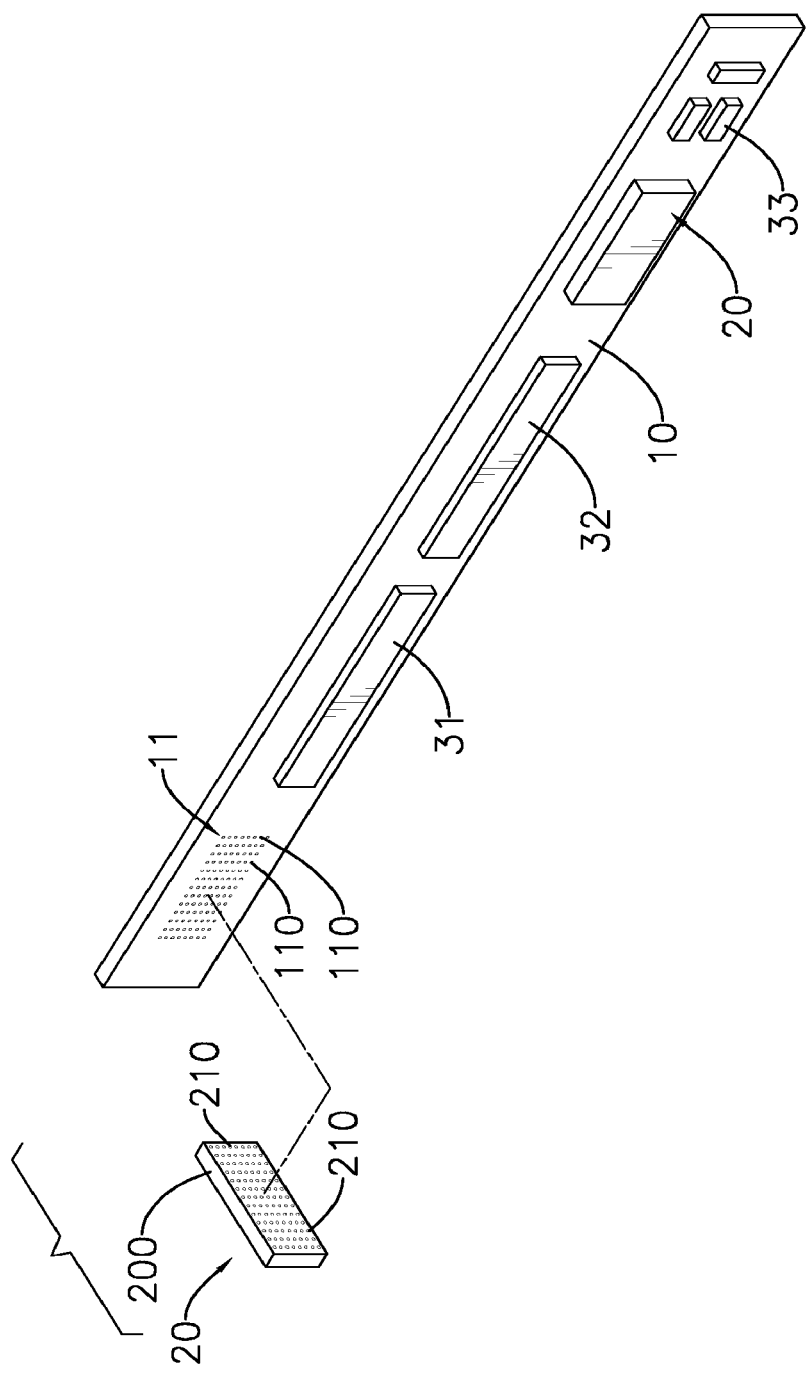
FIG. 1 is a partially exploded perspective view of a screen control module in accordance with the present invention.

With reference to FIG. 1, a screen control module in accordance with the present invention is mounted on a circuit board 10, and has at least one controller 20, at least one connector 31, 32 and multiple passive elements 33. In the present embodiment, the screen control module has two controllers 20, two connectors 31, 32 and multiple passive elements 33. It is stressed that the embodiment serves for exemplary purpose instead of limiting the elements specifically constituting the screen control module. The screen control module is connected to a liquid crystal diode (LCD) display panel and/or a touch panel inside the flip-up lid through the connectors 31, 32. Each one of the at least one controller 20 is an LCD panel controller when connected to an LCD display panel, and a touch panel controller when connected to a touch panel.

In the present embodiment, the controllers 20, the connectors 31, 32 and the passive elements 33 are mounted on one surface of the circuit board 10. The connectors 31, 32 and the passive elements 33 are mounted by through-hole soldering means, surface mount technology (SMT) and the like, which pertain to techniques known to persons in the related field and are not repeated here.

The circuit board 10 is slender and elongated. The circuit board 10 is implemented with a length range of 50-80 millimeters (hereinafter mm) and a width range less than or equal to 9 mm. The circuit board 10 has at least one elongated electrical connection interface 11 for mounting the respective controller 20. Each one of the at least one electrical connection interface 11 is composed of multiple solder pads 110 formed on the surface of the circuit board 10. The solder pads 110 respectively align along a first direction and a second direction. In the present embodiment, the first direction is a length direction of the circuit board 10, and the second direction is a width direction of the circuit board 10 perpendicular to the length direction. In other words, the solder pads 110 are arranged in the form of a matrix. The number of the solder pads 110 along the length direction is greater than that along the width direction. For example, the number of the solder pads 110 along the length direction is 20 and the number of the solder pads 110 along the width direction is 8.

Figure 2:
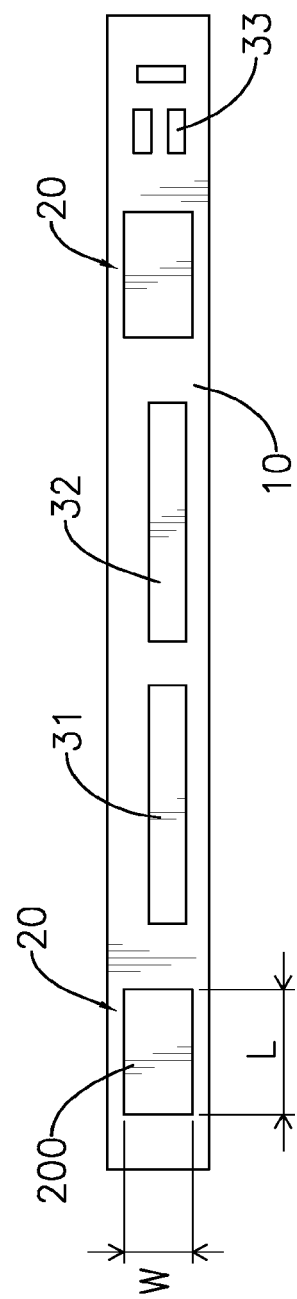
FIG. 2 is a side view of the screen of the screen control module in FIG. 1.

With reference to FIG. 2, the controller 20 is formed by integrated circuits and has a package 200. The package 200 has a length L and a width W. The length L is greater than the width W and an aspect ratio (Length over width) is not less than 2. The aspect ratio can be implemented in a range of 2-4. The package 200 can be implemented with a length in a range less than 20 mm and preferably from 10 mm to 13 mm and a width in a range less than or equal to 6 mm. As being slender and elongated, the package 200 has greater than or equal to 100 electrical contacts 210 formed on a bottom surface of the package 200. The electrical contacts 210 respectively align along a length direction and a width direction of the package 200. The length direction and the width direction of the package 200 are respectively parallel to the first direction and the second direction. In other words, the electrical contacts 210 are arranged in the form of a matrix. The number of the electrical contacts 210 along the length direction of the package 200 is greater than that along the width direction of the package 200. The electrical contacts 210 can be arranged and located to correspond to the respective solder pads 110 and electrically connect therewith.

Here is a table listing the aspect ratio and the number of electrical contacts of several types of packages 200 as follows.

| Package | | |
| --- | --- | --- |
| Length * Width | Aspect Ratio | Number of electrical contacts |
| 10.0 mm * 5.0 mm | 2 | 132 |
| 10.5 mm * 4.5 mm | 2.33 | 160 |
| 13.0 mm * 5.0 mm | 2.6 | 168 |

The forms of the electrical contacts 210 of the package 200 of the foregoing controller 20 vary according to the adopted packaging technology. In the present embodiment, the controller 20 is a ball grid array (BGA) element, and the electrical contacts 210 on the package 200 are formed by solder balls. Besides, when the controller 20 is a chip scale packaging (CSP) element or a wafer level chip scale packaging (WLCSP) element, the electrical contacts 210 on the package 200 are still formed by solder balls. When the controller 20 is a land grid array (LGA) element, which is free of solder balls, the solder pads on the bottom surface of the controller 20 constitute the electrical contacts 210 on the package 200.

Figure 3:
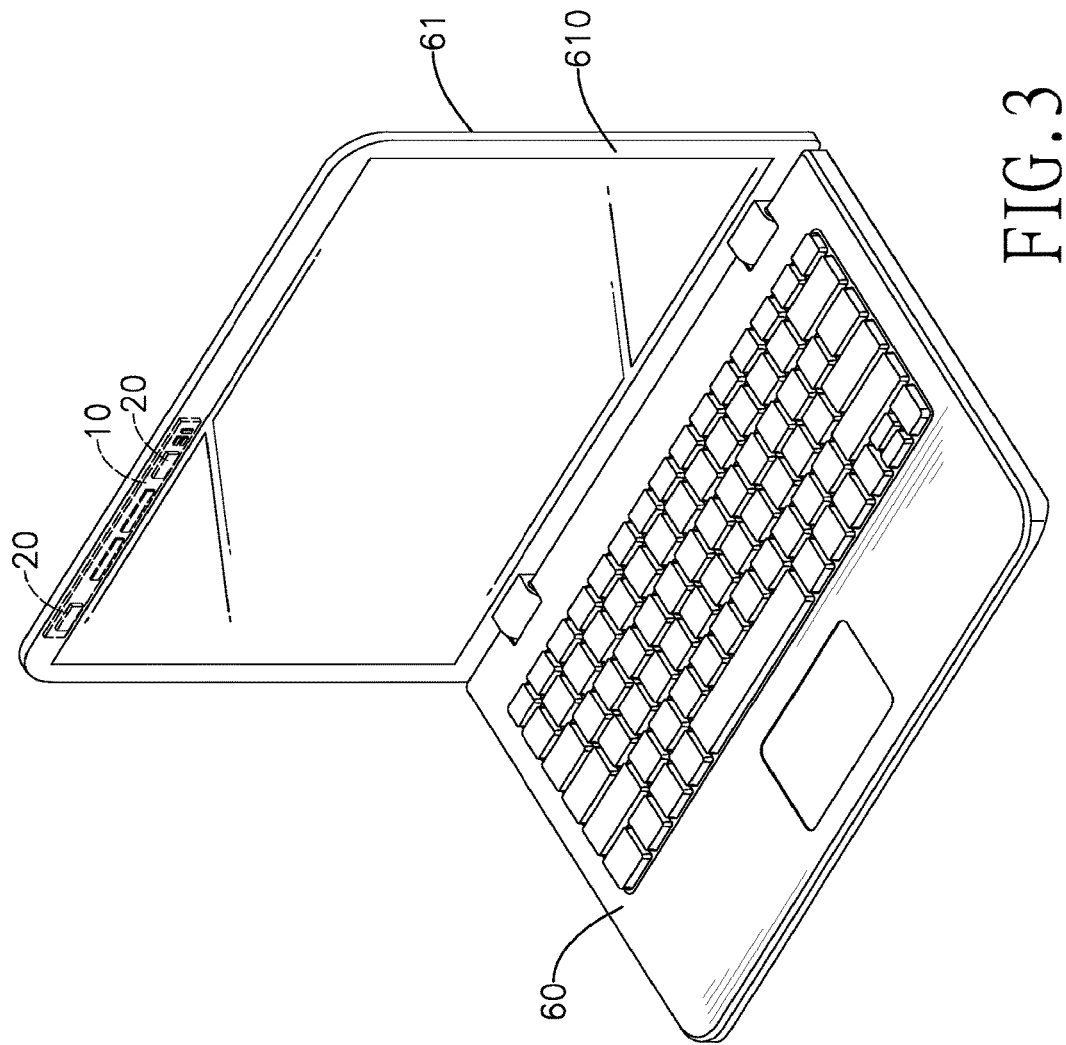
FIG. 3 is a perspective view of a notebook computer having the screen control module in FIG. 1 mounted therein.
Figure 4:
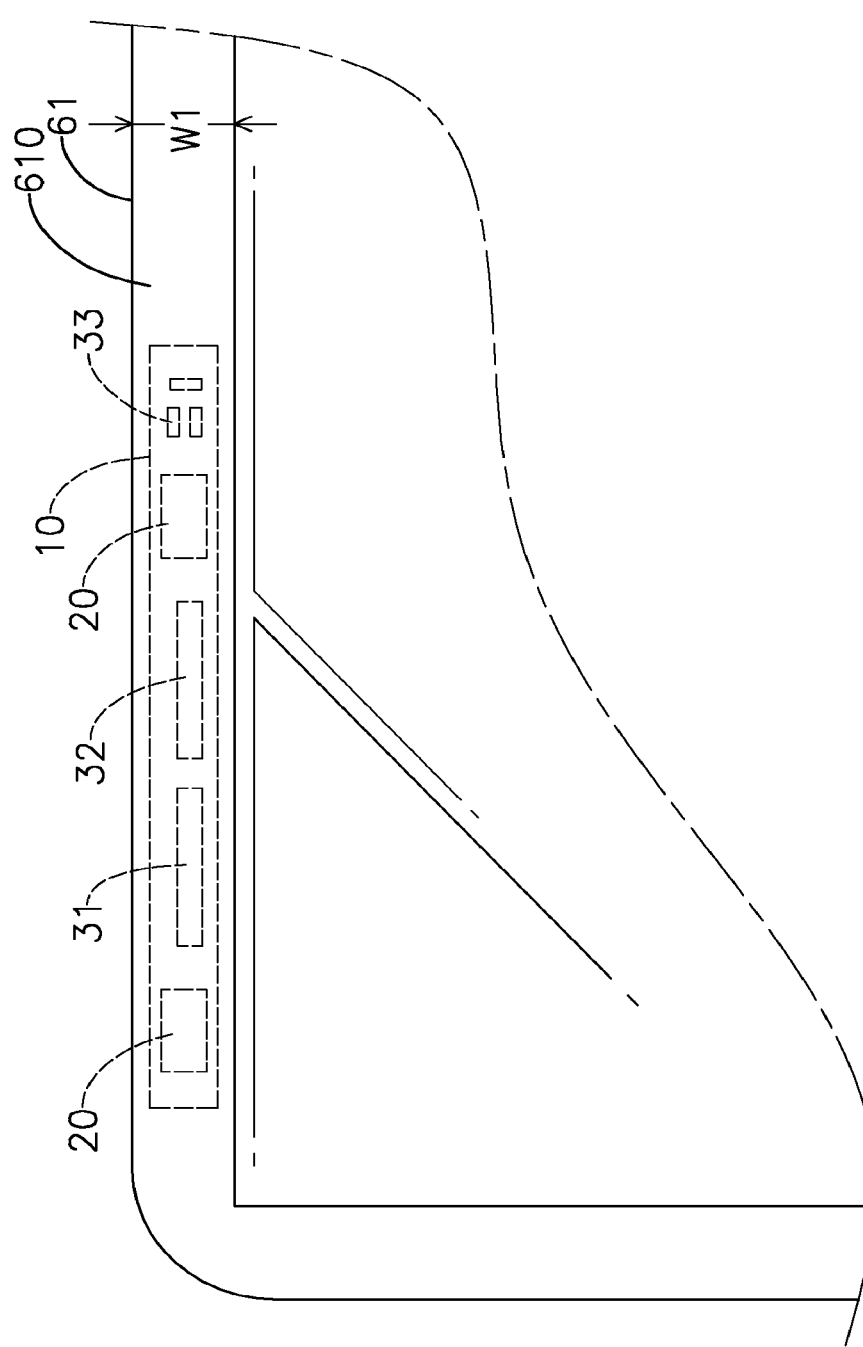
FIG. 4 is a partially enlarged front view of the notebook computer in FIG. 3.

As described earlier, the solder pads 110 on the circuit board 10 respectively align along the first direction and the second direction, and the number of the solder pads 110 along the first direction is greater than the number of the solder pads 110 along the second direction, thereby constituting an elongated electrical connection interface aligning and connected with a corresponding controller 20 having multiple electrical contacts 210 with an identical alignment. Under the matching relationship, the package 200 of the controller 20 can expand its aspect ratio. When the length L is extended and the width W is shortened, the ratio between the width of the controller 20 and that of the circuit board 10 can be reduced. Hence, the width of the circuit board 10 and the width of the screen control module can be also reduced to eliminate the concern that the screen control module dominates the reduction of the width of the side frame of the flip-up lid. With reference to FIGS. 3 and 4, when the screen control module is mounted inside a flip-up lid 61 of a notebook computer 60, a width W1 of a side frame 610 of the flip-up lid 61 can thus be reduced to expand an effective display area of the display monitor.

From the foregoing embodiment, the aspect ratio of the package 200 of the controller 20 is increased to aim at reducing the ratio between the widths of the controller 20 and the circuit board 10. To prevent warp from occurring when the controller 20 is mounted (such as reflow), the following technical approaches are further addressed in response to the warp that might occur.

Figure 5:
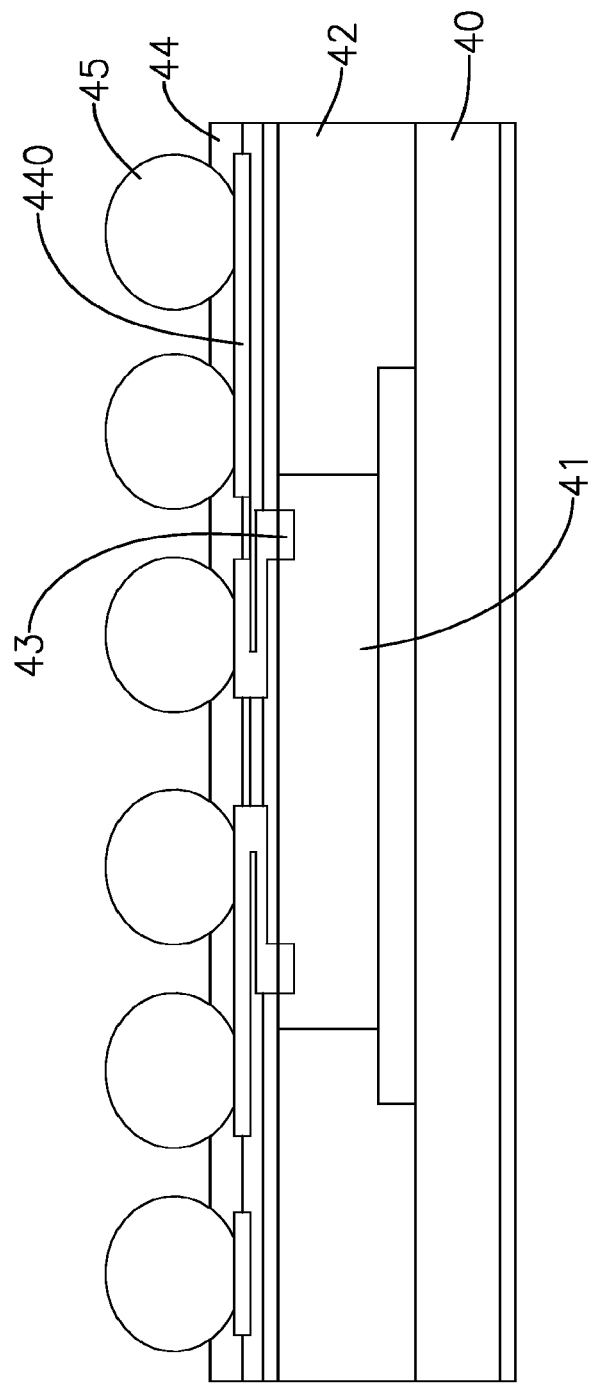
FIG. 5 is a plane view of a WLCSP (Wafer Level Chip Scale Packaging) element adopted by a controller of the screen control module in FIG. 1.

One of the technical approaches is to employ a WLCSP element in the controller 20. With reference to FIG. 5, a WLCSP element in accordance with the present invention has a silicon substrate 40, a chip 41, a protection adhesive layer 42, multiple pads 43, a dielectric layer 44 and multiple solder balls 45. The chip 41 is mounted on a surface of the silicon substrate 40. The protection adhesive layer 42 is formed around the chip 41. The pads 43 are implanted on a surface of the chip 41. The dielectric layer 44 is formed on tops of the chip 41 and the protection adhesive layer 42, and has inner-layer wires 440. The solder balls 45 are implanted on a surface of the dielectric layer 44. Each solder ball 45 is electrically connected to one of the pads 43 on the chip 41 through a corresponding inter-layer wire 440 of the dielectric layer 44.

As the above-mentioned WLCSP element is completed during a wafer fabrication process and the chip 41 and the silicon substrate 40 are all made by silicon, the low thermal expansion coefficient of their laminate can effectively mitigate the warp effect on elements due to heat generated during a reflow process.

Figure 6A:
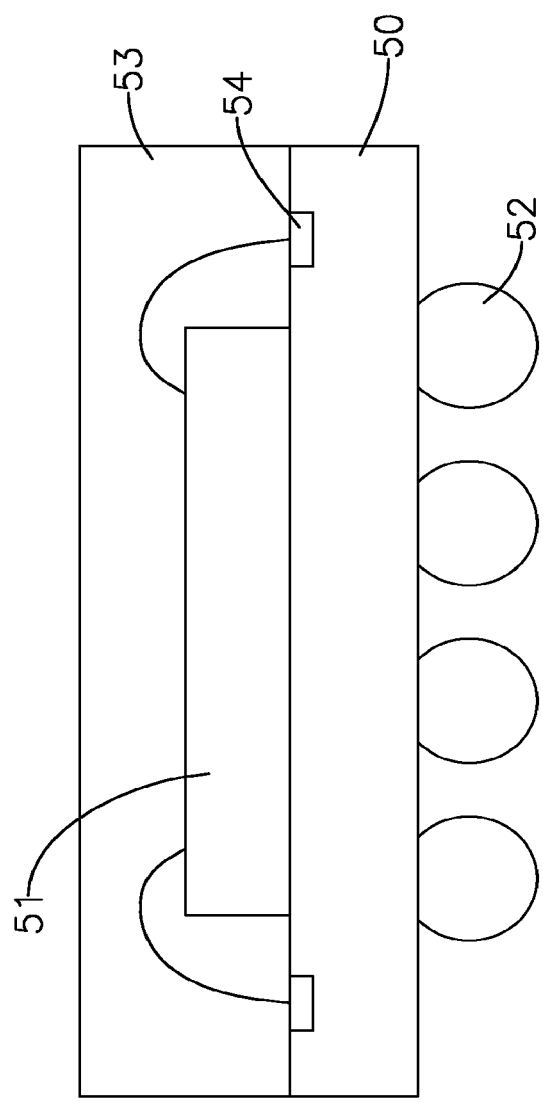
FIG. 6A is a plane view of one CSP (Chip Scale Packaging) element adopted by a controller of the screen control module in FIG. 1.

Another technical approach is to employ a CCL substrate as a packaging substrate. The anti-warp capability of the CCL substrate is adopted to tackle the warp effect on the packaging substrate during a reflow process. With reference to FIG. 6A, a typical chip scale package (CSP) element in accordance with the present invention has a packaging substrate 50, a chip 51, multiple bumps 54, multiple first solder balls 52 and an insulation layer 53. The packaging substrate 50 has inner-layer wires. The chip 51 is mounted on a top surface of the packaging substrate 50. The bumps 54 are formed on the top surface of the packaging substrate 50. The solder balls 52 are formed on a bottom surface of the packaging substrate 50. The solder balls 52 and the bumps 54 are mutually connected through corresponding inner-layer wires. The chip 51 has multiple solder pads formed on a top surface of the chip 51 and electrically connected to the respective bumps 54 on the top surface of the packaging substrate 50 through wire bonding. The insulation layer 53 is formed on the packaging substrate 50 to cover the chip in completion of the package.

Figure 6B:
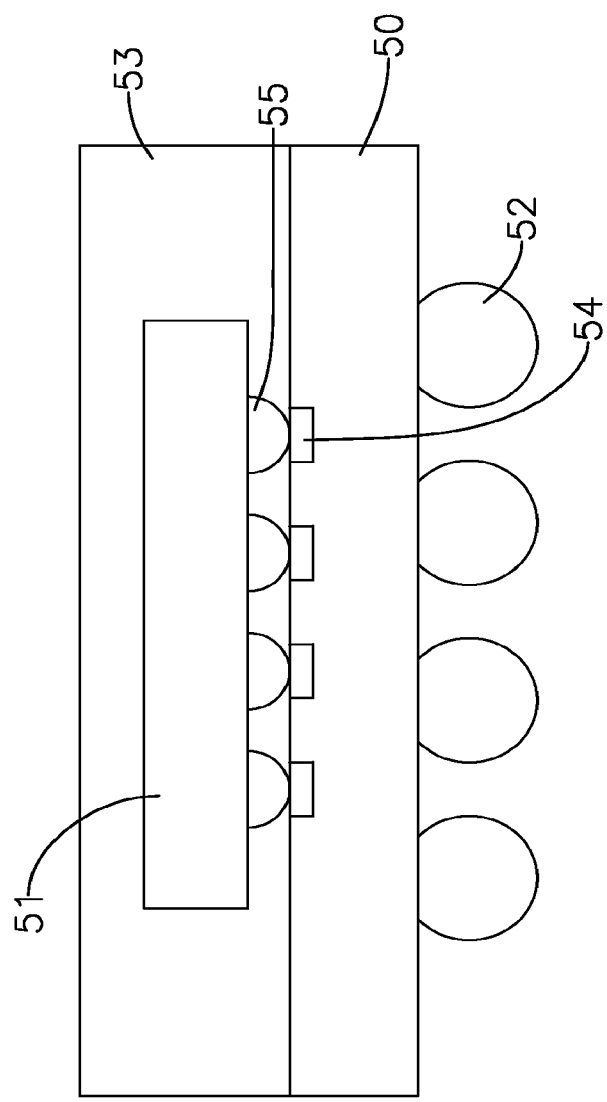
FIG. 6B is a plane view of another CSP (Chip Scale Packaging) element adopted by a controller of the screen control module in FIG. 1.
Figure 7:
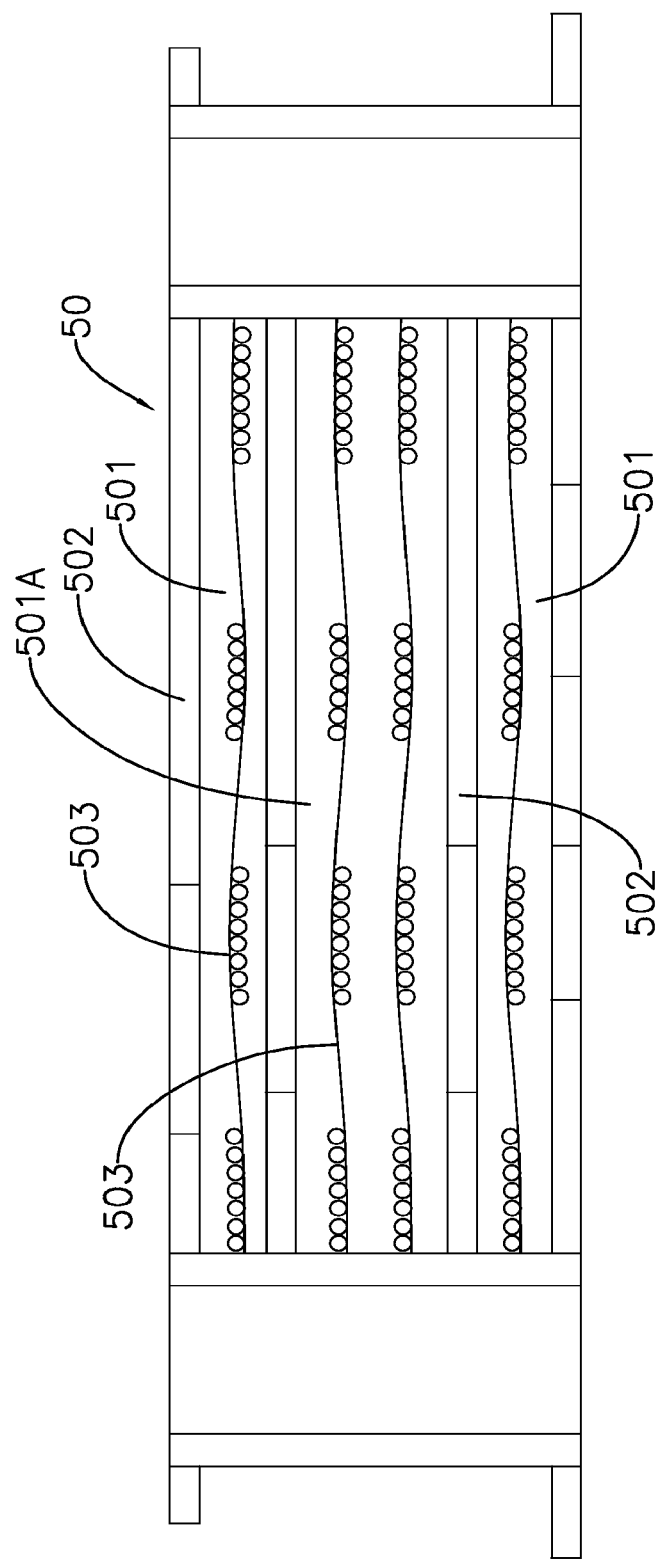
FIG. 7 is a plane view of a substrate adopted by a controller of the screen control module in FIG. 1.
Figure 8:
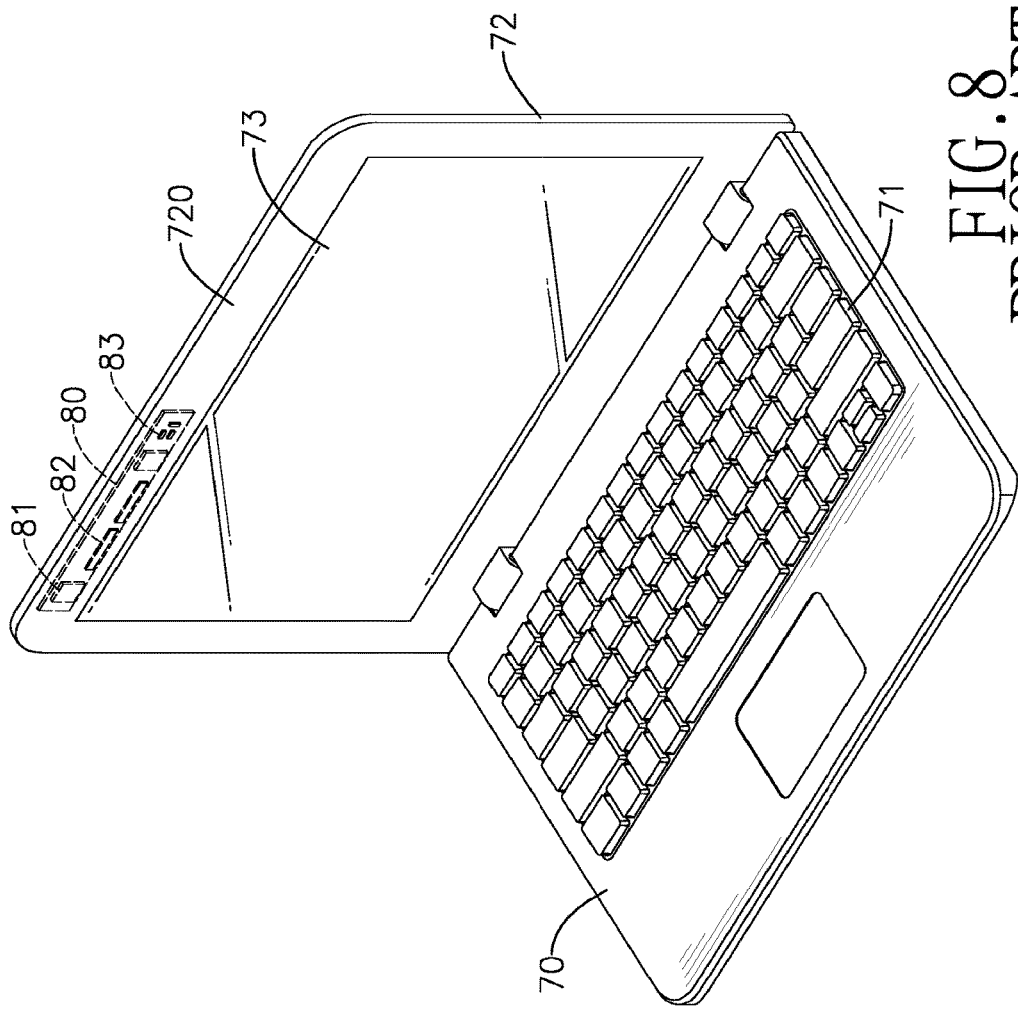
FIG. 8 is a perspective view of a conventional notebook computer.
Figure 9:
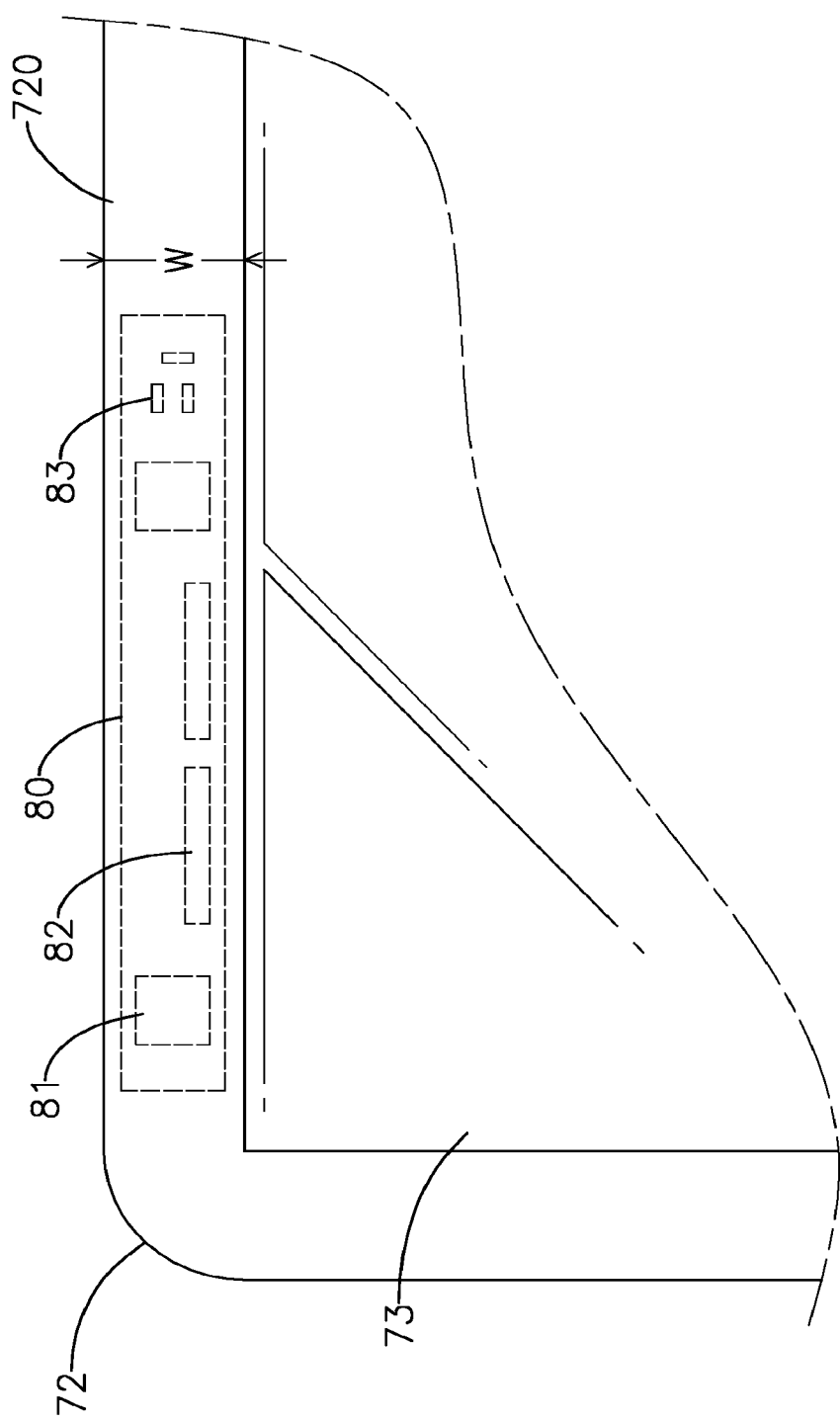
FIG. 9 is a partially enlarged side view of the notebook computer in FIG. 8 having a screen control module mounted in the lid of the notebook computer.
Figure 10:
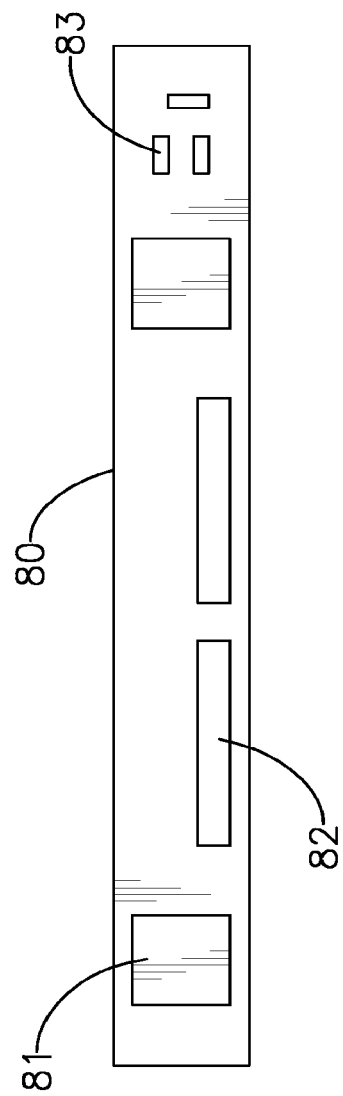
FIG. 10 is a side view of a conventional screen control module.

With reference to FIG. 6B, a CSP element with a flip chip (FC) structure in accordance with the present invention has a packaging substrate 50, a chip 51, multiple bumps 54, multiple first solder balls 52, multiple second solder balls 55 and an insulation layer 53. The packaging substrate 50 has inner-layer wires. The chip 51 in the form of an FC structure is implanted on a top surface of the packaging substrate 50. The bumps 54 are formed on the top surface of the packaging substrate 50. The first solder balls 52 are implanted on a bottom surface of the packaging substrate 50. The bumps 54 and the solder balls 52 are mutually connected through the inner-layer wires. The second solder balls 55 are implanted on the top surface of the chip 51 in the form of an FC structure to electrically connect to the bumps 54 on the top surface of the packaging substrate 50. The insulation layer 53 is formed on the packaging substrate 50 to cover the chip in completion of the package.

When being a CCL substrate, the packaging substrate 50 has multiple dielectric layers 501 and multiple copper wire layers 502 alternately stacked to constitute a multi-layer substrate. Each dielectric layer 501, 501A respectively has at least one layer of glass fiber cloth 503. To enhance the anti-warp strength of the multi-layer substrate, a thickness of the glass fiber cloth 503 inside at least one dielectric layer 501A can be reduced while the number of layer for the glass fiber cloth 503 inside the dielectric layer 501A is increased. In other words, if the dielectric layer 501A has multiple layers of glass fiber cloth 503, a thickness of the dielectric layer 501A is 0.15 mm, and an original thickness of the glass fiber cloth 503 is 0.14 mm (cloth number 1056), the thickness of the glass fiber cloth 503 can be reduced to 0.05 mm (cloth number 1086) and the number of layer for the glass fiber cloth can be increased. When the thickness of the dielectric layer 501A is 0.25 mm and the original thickness of each of the two layers of glass fiber cloth 503 is 0.09 mm (cloth number 2116), the thickness of the glass fiber cloth 503 can be reduced to 0.08 mm (cloth number 3313) and the number of layer for the glass fiber cloth can be increased.

Mounting glass fiber cloth in the dielectric layer 501, 501A of regular CCL substrate is intended to provide significant anti-warp capability. Adding more layers of glass fiber cloth 503 in an identical dielectric layer 501A can further raise the anti-warp strength.

In sum, the solder pads of the screen control module of the present invention respectively align along the first direction and the second direction. Given the condition that the number of the solder pads along the first direction is greater than the number of the solder pads along the second direction, an elongated electrical connection interface can be formed. A controller having multiple electrical contacts identically arranged on the elongated package thereof to correspond to and connect with the respective solder pads. Under the foregoing design, the package of the controller can increase its aspect ratio. Under the circumstance of longer length and shorter width, the ratio between the width of the controller and the width of the circuit board can be reduced. Accordingly, the width of the circuit board can be reduced and the width of the screen control module can be also reduced, thereby satisfying the need of reducing the width of the side frame of the flip-up lid.

Even though numerous characteristics and advantages of the present invention have been set forth in the foregoing description, together with details of the structure and function of the invention, the disclosure is illustrative only. Changes may be made in detail, especially in matters of shape, size, and arrangement of parts within the principles of the invention to the full extent indicated by the broad general meaning of the terms in which the appended claims are expressed.

What is claimed is:

1. A screen control module of a mobile electronic device, comprising:
    a circuit board;
    at least one controller, each one of the at least one controller formed by an integrated circuit having a package and mounted on the circuit board, wherein the package has a length and a width, an aspect ratio between the length and the width of the package is greater than or equal to 2:1 and the width of the package is smaller than or equal to 6 millimeters,
    wherein the package has a packaging substrate, the packaging substrate comprises a first metal layer having a first width and a second metal layer having the first width, and
    wherein an area between the first and second metal layers has the first width and consists of a single dielectric layer made of a dielectric material and multiple layers of fiber cloths.

2. The screen control module as claimed in claim 1, wherein the aspect ratio between the length and the width of the package is in a range of 2:1 to 4:1.

3. The screen control module as claimed in claim 2, wherein the length of the package is less than or equal to 20 millimeters.

4. The screen control module as claimed in claim 2, wherein the package of the controller has multiple electrical contacts respectively aligning along a direction of the length and a direction of the width and arranged in a matrix.

5. The screen control module as claimed in claim 4, wherein an amount of the electrical contacts on the package of the controller is greater than or equal to one hundred.

6. The screen control module as claimed in claim 1, wherein a width of the circuit board is less than or equal to 9 millimeters.

7. The screen control module as claimed in claim 1, wherein the controller is a wafer level chip scale packaging (WLCSP) element.

8. The screen control module as claimed in claim 1, wherein the controller is a ball grid array (BGA) element or a land grid array (LGA) element.

9. The screen control module as claimed in claim 1, wherein the controller is a chip scale packaging (CSP) element.

10. A touch panel controller of a screen control module comprising an integrated circuit having a package that is elongated, wherein the package has a length and a width, an aspect ratio between the length and the width of the package is greater than or equal to 2:1 and the width of the package is smaller than or equal to 6 millimeters, the package has multiple electrical contacts,
    wherein the package has a packaging substrate, the packaging substrate comprises a first metal layer having a first width and a second metal layer having the first width, and
    wherein an area between the first and second metal layers has the first width and consists of a single dielectric layer made of a dielectric material and multiple layers of fiber cloth.

11. The controller as claimed in claim 10, wherein the aspect ratio between the length and the width of the package is in a range of 2:1 to 4:1.

12. The controller as claimed in claim 10, wherein the length of the package is less than or equal to 20 millimeters.

13. The controller as claimed in claim 10, wherein an amount of the electrical contacts on the package of the controller is greater than or equal to one hundred and the electrical contacts respectively align along a direction of the length and a direction of the width and arranged in a matrix.

14. The controller as claimed in claim 10, wherein the controller is a WLCSP element.

15. The controller as claimed in claim 10, wherein the controller is a BGA element or an LGA element.

16. The controller as claimed in claim 10, wherein the controller is a CSP element.

* * * * *